(12) United States Patent
Teo et al.

(10) Patent No.: US 10,418,474 B2
(45) Date of Patent: Sep. 17, 2019

(54) HIGH ELECTRON MOBILITY TRANSISTOR WITH VARYING SEMICONDUCTOR LAYER

(71) Applicant: Mitsubishi Electric Research Laboratories, Inc., Cambridge, MA (US)

(72) Inventors: Koon Hoo Teo, Lexington, MA (US); Nadim Chowdhury, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 15/785,566

(22) Filed: Oct. 17, 2017

(65) Prior Publication Data

US 2019/0115462 A1 Apr. 18, 2019

(51) Int. Cl.
*H01L 29/15* (2006.01)
*H01L 31/0256* (2006.01)
*H01L 29/778* (2006.01)
*H01L 29/06* (2006.01)
*H01L 29/10* (2006.01)
*H01L 29/66* (2006.01)
(Continued)

(52) U.S. Cl.
CPC ...... *H01L 29/7787* (2013.01); *H01L 29/0684* (2013.01); *H01L 29/10* (2013.01); *H01L 29/1029* (2013.01); *H01L 29/1037* (2013.01); *H01L 29/1066* (2013.01); *H01L 29/42316* (2013.01); *H01L 29/42368* (2013.01); *H01L 29/66462* (2013.01); *H01L 29/7783* (2013.01); *H01L 29/7786* (2013.01); *H01L 29/2003* (2013.01)

(58) Field of Classification Search
CPC . H01L 29/7787; H01L 29/0684; H01L 29/10; H01L 29/66462
See application file for complete search history.

(56) References Cited

U.S. PATENT DOCUMENTS 7,161,194 B2  1/2007  Parikh et al.
7,692,263 B2  4/2010  Wu et al.
(Continued)

FOREIGN PATENT DOCUMENTS

JP  2013247297 A  *  12/2013
WO  2018119037 A1  6/2018

OTHER PUBLICATIONS

Chatterjee et al., "Analysis of AlGaN/GaN High Electron Mobility Transistor for High Frequency Application," 2017 Devices for Integrated Circuit (Devic) IEEE, Mar. 23, 2017, pp. 196-199.

*Primary Examiner* — Calvin Y Choi
(74) *Attorney, Agent, or Firm* — Gennadiy Vinokur; James McAleenan; Hironori Tsukamoto

(57) ABSTRACT

A high electron mobility transistor (HEMT) includes a semiconductor structure including a cap layer and a channel layer forming a heterojunction, such that a two dimensional electron gas is formed at the interface of cap layer and the channel layer. The HEMT also includes a set of electrodes including a source electrode, a drain electrode, and a gate electrode deposited on the cap layer. The gate electrode is arranged between the source and the drain electrode along the length of the HEMT. The thickness of the cap layer at least under the gate electrode is varying along the width of the HEMT.

19 Claims, 13 Drawing Sheets

(51) Int. Cl.
*H01L 29/423* (2006.01)
*H01L 29/20* (2006.01)

(56) References Cited

U.S. PATENT DOCUMENTS

| | | | |
|---|---|---|---|
| 7,853,235 | B2 | 12/2010 | Aparin |
| 9,419,124 | B2 | 8/2016 | Parikh et al. |
| 9,647,103 | B2 * | 5/2017 | Koudymov ......... H01L 29/7786 |
| 9,673,311 | B1 | 6/2017 | Moens et al. |
| 9,711,616 | B2 | 7/2017 | Stewart et al. |
| 9,755,059 | B2 | 9/2017 | Sriram |
| 2009/0309162 | A1 | 12/2009 | Baumgartner et al. |
| 2012/0032699 | A1 * | 2/2012 | Fukuhara ............. G01R 31/025 324/762.05 |
| 2014/0209922 | A1 * | 7/2014 | Ota ................... H01L 29/42316 257/76 |
| 2015/0357454 | A1 * | 12/2015 | Lutgen ................ H01L 29/7783 257/76 |
| 2016/0079406 | A1 | 3/2016 | Oasa et al. |
| 2016/0181364 | A1 | 6/2016 | Stewart et al. |
| 2016/0240645 | A1 | 8/2016 | Prechtl et al. |

\* cited by examiner

HIGH ELECTRON MOBILITY TRANSISTOR WITH VARYING SEMICONDUCTOR LAYER

TECHNICAL FIELD

The present invention relates generally to semiconductor device such as high electron mobility transistors for high frequency applications.

BACKGROUND

Materials such as silicon (Si) and gallium arsenide (GaAs) have found wide application in semiconductor devices. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages. In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ cm$^{-2}$. Additionally, electrons that originate in the wider-bandgap semiconductor transfer to the 2DEG, allowing a high electron mobility due to reduced ionized impurity scattering.

This combination of high carrier concentration and high carrier mobility can increase transconductance of the HEMT and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity.

One of the performance metric for RF transistor is the linearity. A transistor with high linearity consumes lower power when used is Low Noise Amplifier (LNA) or Power Amplifier (PA). Currently the problem of linearity in a power amplifier is solved at the circuit level by employing various linearization techniques, such as derivative superposition, however, usage of these techniques is expensive. Hence, there is a need to design a transistor with high linearity and higher power density.

SUMMARY

Some embodiments are based on recognition that the linearity of a transistor depends on the increase of transconductance with respect to the gate voltage. A gradual increase of transconductance yields high linearity whereas a rapid increase of transconductance results in low linearity. The graduality of transconductance is dictated by the structure and the property of the material forming the transistor, and is challenging to control.

For example, different materials can be used to form a gate of the transistor, but properties of metal suitable to modulate the conductivity of the carrier channel result in relatively low linearity. Additionally, or alternatively, the linearity can be increased by reducing the width of the gate of the transistor. However, such a reduction also reduces carrier density, which is undesirable.

Some embodiments are based on recognition that density of the carrier channel such as two dimensional electron gas (2-DEG) density depends on the thickness of the cap layer of the high electron mobility transistor (HEMT). As used herein, the cap layer is a top layer that in combination with another semiconductor layer, referred herein as a channel layer, forms a heterojunction. Hence, by varying the thickness of the cap layer, the density of the 2-DEG can also be varied along the width of the device.

Specifically, the threshold voltage of the HEMT is a function of both the thickness of the cap layer and the 2-DEG density. Therefore, varying thickness of the cap layer results in varying threshold voltages. For example, a staircase profile of the cap layer creates a HEMT with multiple virtual channels each having different threshold voltage between the source and the drain.

Accordingly, one embodiment discloses a high electron mobility transistor (HEMT) including a semiconductor structure including a cap layer and a channel layer forming a heterojunction, such that a two dimensional electron gas is formed at the interface of cap layer and the channel layer; and a set of electrodes including a source electrode, a drain electrode, and a gate electrode deposited on the cap layer, wherein the gate electrode is arranged between the source and the drain electrode along the length of the HEMT, wherein the thickness of the cap layer at least under the gate electrode is varying along the width of the HEMT.

In some implementations, a cross-section of the cap layer under the gate electrode has a stair case shape having at least two trends and risers. The cap layer can have identical profile along its entire length or can have a constant thickness of the cap layer outside the gate electrode.

Another embodiment discloses a method for manufacturing a high electron mobility transistor (HEMT). The method includes providing a substrate and a semiconductor structure with at least one carrier channel; etching the semiconductor structure to define an active region of the HEMT; forming a source and a drain electrode by one or combination of a metal deposition, a lift-off, and a rapid thermal annealing; forming a cap layer having a varying thickness by repeated lithography and etching; and forming the gate electrode.

DETAILED DESCRIPTION

Figure 1A:
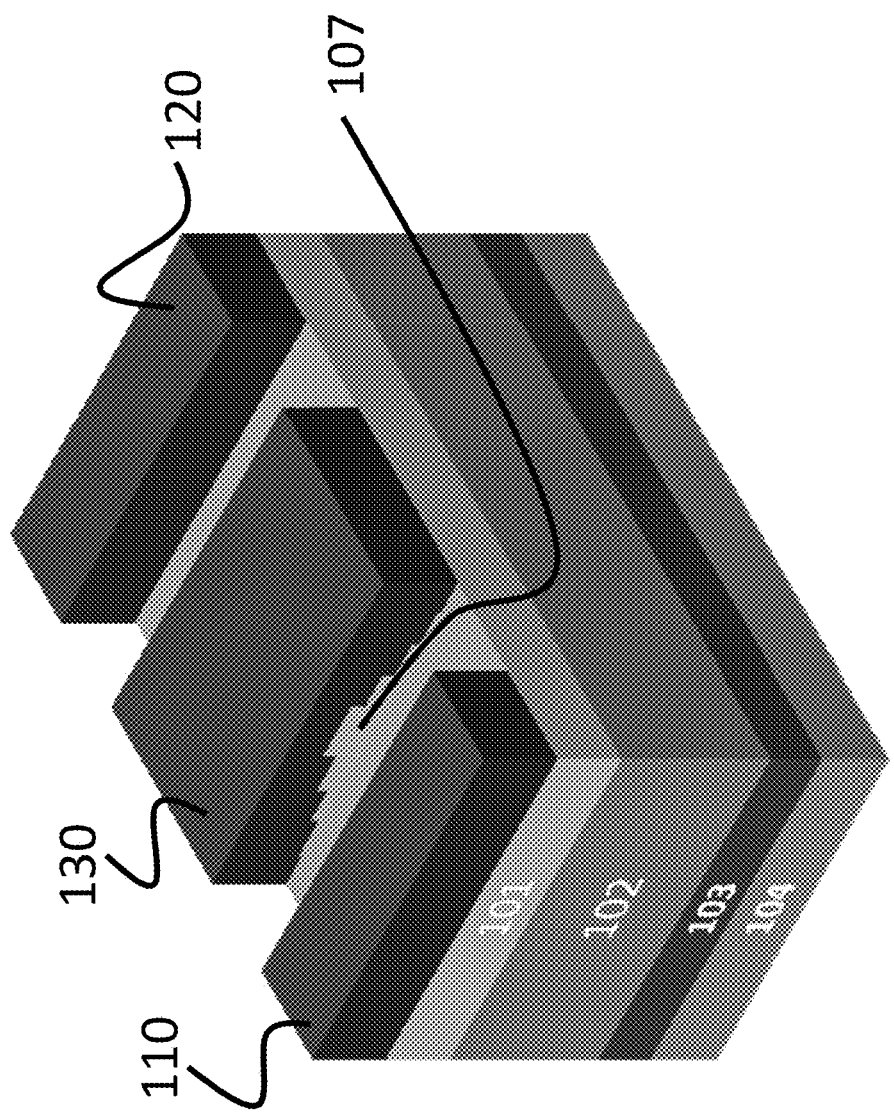
FIG. 1A shows the 3-Dimensional schematic of a semiconductor device according to one embodiment.

FIG. 1A shows the 3-Dimensional schematic of a semiconductor device according to one embodiment. The semiconductor device includes a cap layer 101 and beneath the cap layer there is a channel layer 102 so that at the interface of cap layer and channel layer there forms a two dimensional electron gas (2-DEG). To that end, the device of FIG. 1A is a high electron mobility transistor (HEMT).

In some implementations, for the mechanical support during the fabrication process and packaging purposed these cap layer and channel layer are formed on a substrate 105 through the help of a buffer layer 104. A source electrode 110 and a drain electrode 120 are provided to carry and amplify an electrical signal through the 2-DEG channel layer. To modulate the conductivity of the channel a gate electrode is provided on top of the cap layer.

In various embodiments, the thickness of the cap layer at least under the gate electrode is varying along the width of the HEMT. For example, in one embodiment, a cross-section of the cap layer under the gate electrode has a stair case shape 107 having at least two trends and risers.

Figure 1B:
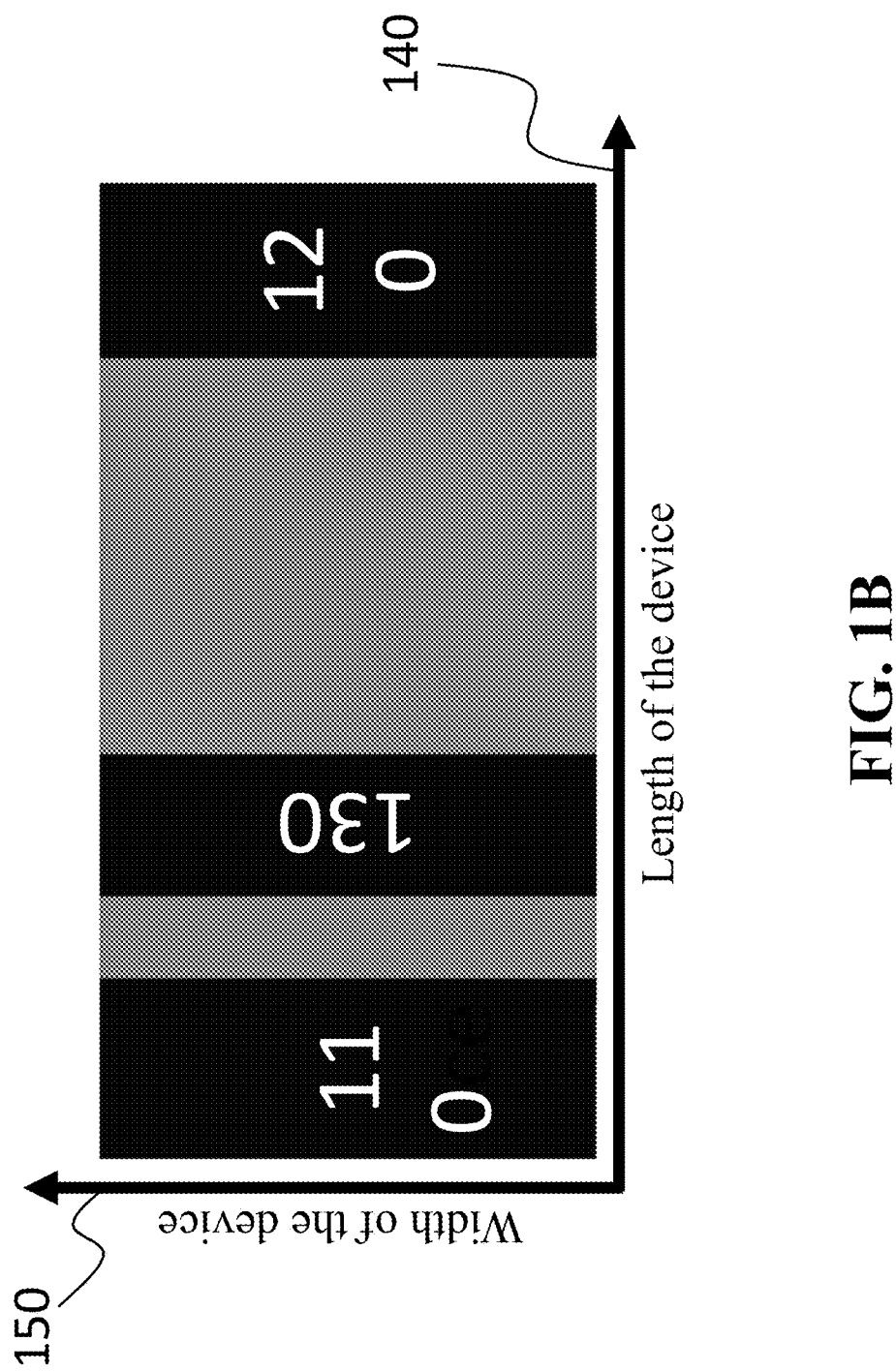
FIG. 1B shows the top view of a high electron mobility transistor (HEMT) according to some embodiment.

FIG. 1B shows the top view of the HEMT according to some embodiment. As exhibited in this figure the top plane has two directions: One direction 140 is along the length of the device (i.e. from the source electrode towards the drain electrode) and the other direction 150 is along the width of the device. The variations of thickness, e.g., the staircase profile in the cap layer, are formed along the direction of the width of the device.

Figure 1C:
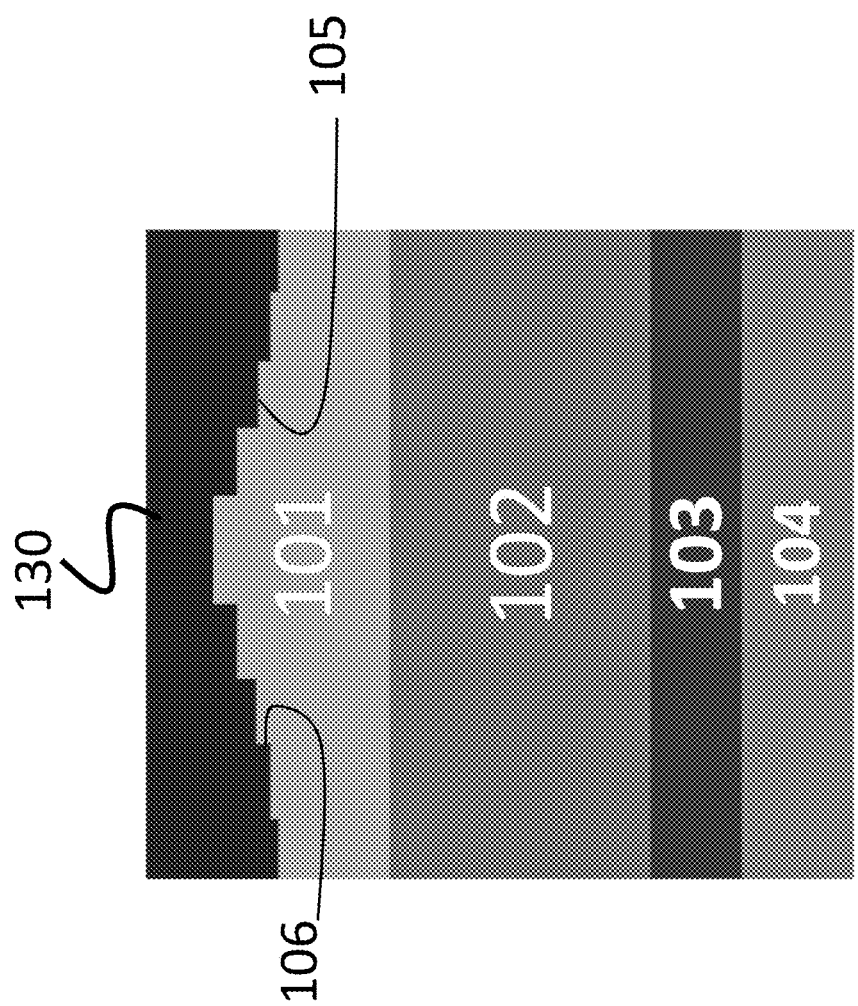
FIG. 1C shows the cross section view in the middle of the channel along the width of the HEMT according to one embodiment.

FIG. 1C shows the cross section view in the middle of the channel along the width of the device demonstrating that the cap layer beneath the gate electrode has a stair case shape according to one embodiment. As shown in FIG. 1C, the shape or profile of the cap layer 101 includes multiple trends 105 and risers 106. Here for the demonstration purpose only 9 trends with 8 risers are shown in the figure. However, in principle the higher the number of trends and risers the better would be linearity performance of the device. Here the width of different trends could be identical or different. And also the heights of different risers could also be different. In this example, the shape of the gate or the thickness of the gate can also vary but it has minimum influence on the performance of the transistor.

Some embodiments are based on recognition that density of the carrier channel such as two dimensional electron gas (2-DEG) density depends on the thickness of the cap layer of the high electron mobility transistor (HEMT). As used herein, the cap layer is a top layer that in combination with another semiconductor layer, referred herein as a channel layer, forms a heterojunction. Hence, by varying the thickness of the cap layer, the density of the 2-DEG can also be varied along the width of the device.

The threshold voltage of the HEMT is a function of both the thickness of the cap layer and the 2-DEG density. Therefore, varying thickness of the cap layer results in varying threshold voltages. Specifically, threshold voltage can be determined according to $$V_T = \varphi_b - \Delta E_C - \frac{qN_s t_{cap}}{\epsilon_{cap}}, \quad (1)$$

wherein $V_T$ is the threshold voltage of a HEMT, $\varphi_b$ is the schottkey barrier height, $\Delta E_C$ is the conduction band discontinuity between the cap layer and the channel layer, $N_s$ is the 2-DEG density, $t_{cap}$ is the cap layer thickness, $\epsilon_{cap}$ is the permittivity of the cap layer thickness. Therefore, by having a staircase cap layer we care creating a HEMT with multiple virtual channels each having different threshold voltage between the source and the drain.

Figure 1D:
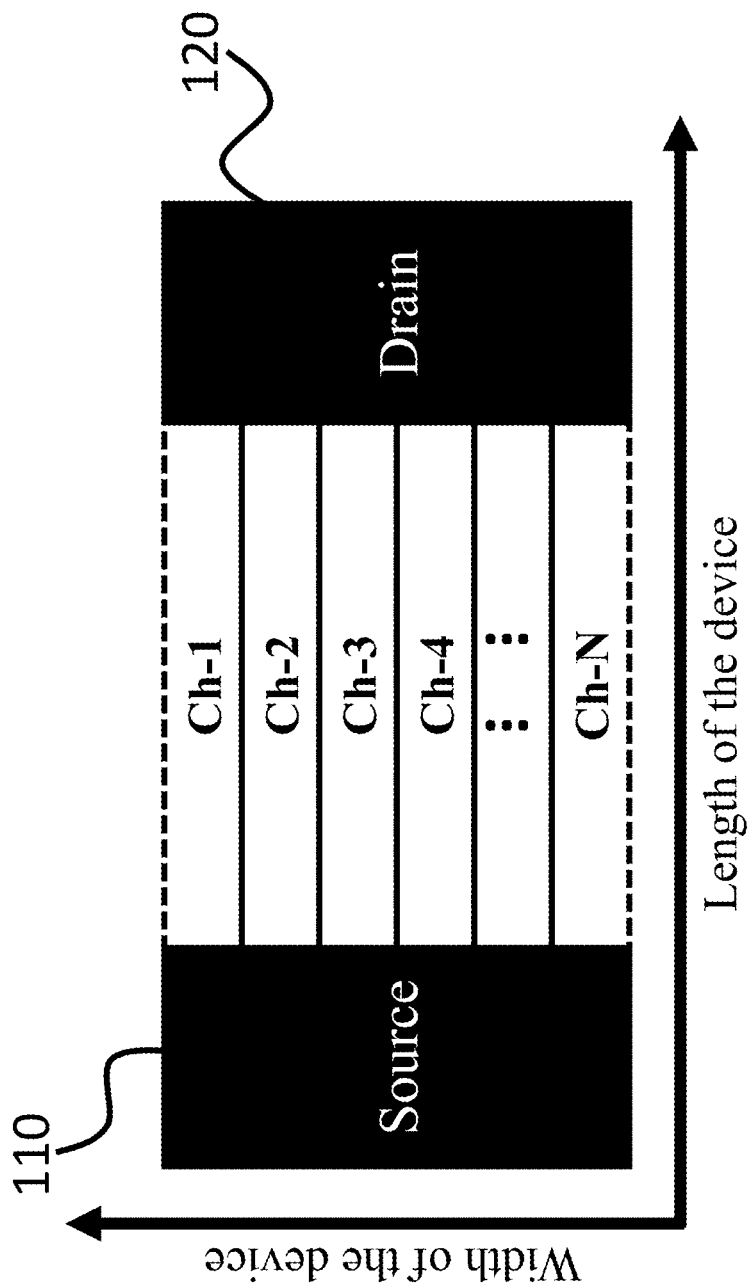
FIG. 1D shows the schematic of virtual channels in HEMT according to some embodiments.

FIG. 1D shows the schematic of how virtual channels Ch-1, Ch-2, . . . Ch-N that are formed in the semiconductor structure between the source and the drain according to some embodiments. Here each channel has its own threshold voltage namely, Vth1, Vth2, . . . VthN. The threshold voltages are engineered in such a way that gm3 of one such virtual channel destructively interferes with gm3 of another virtual channel and cancels each other. Thus, the composite device having N such virtual channels is able to provide gm3 close to zero for a very wide range of gate voltage. This phenomenon of destructive interference of gm3 is referred herein as "Derivative Superposition".

Figure 2A:
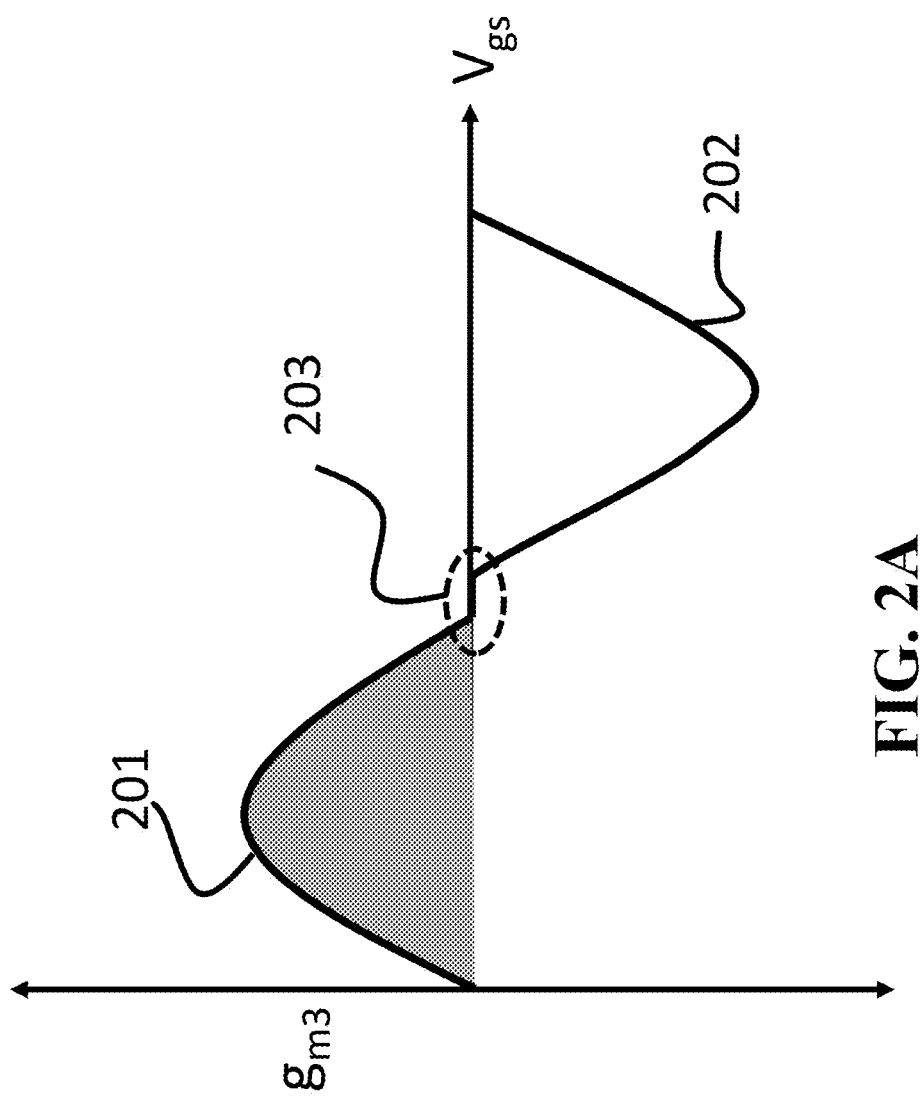
FIGS. 2A and 2B show plots illustrating how a varying thickness of the cap layer along the width of the device according to some embodiments improves the linearity of a semiconductor device.
Figure 2B:
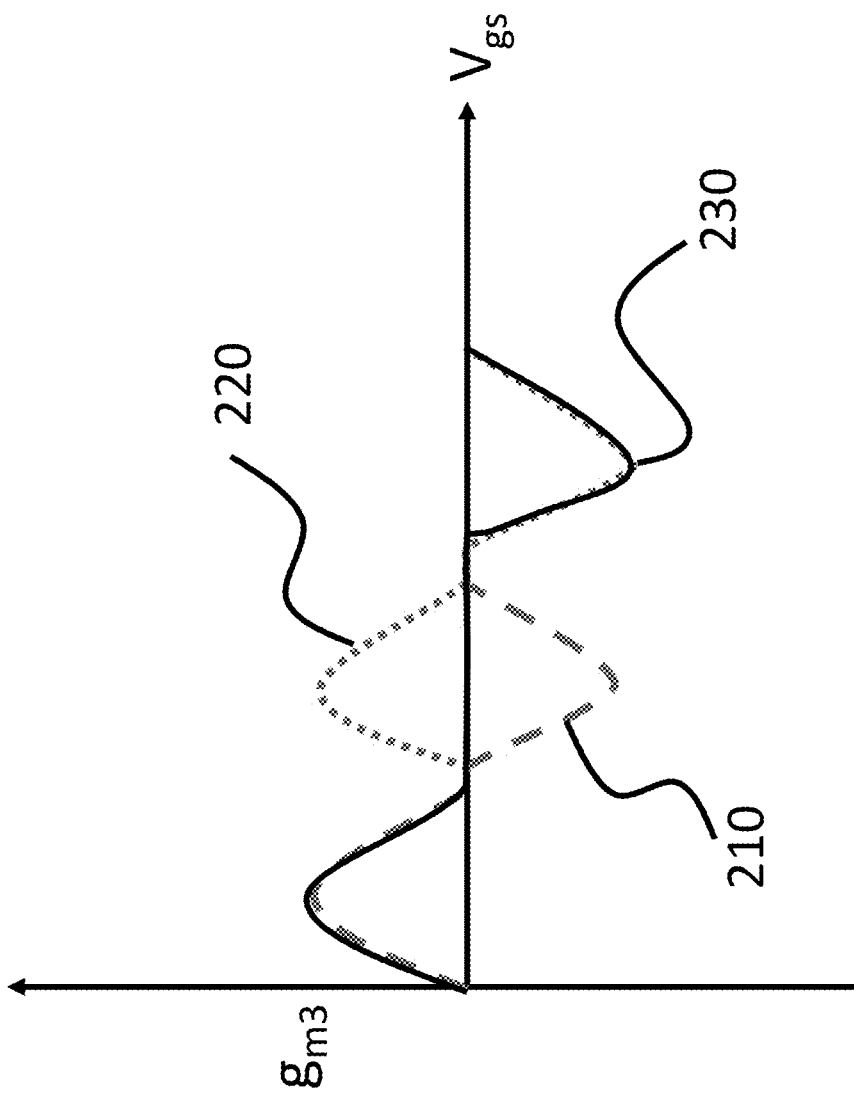

FIGS. 2A and 2B show plots illustrating how a varying thickness of the cap layer along the width of the device according to some embodiments improves the linearity of a semiconductor device. $g_{m3}$ which is defined mathematically by the following expression $$g_{m3} = \frac{d^3 I_{DS}}{dV_{GS}^3},$$

is the hall mark of linearity of any transistor. The lower the magnitude to $g_{m3}$, the higher the linearity.

FIG. 2A shows a plot of the $g_{m3}$ vs gate voltage of a transistor. Things to be noticed in this curve is that any $g_{m3}$ curve would have one positive region (shaded) labeled 201 and one negative region (not-shaded) labeled 202. The transition from positive to negative region happens around the threshold voltage. The region labelled 203 in this figure is the ideal region for operation since it has gm3 value close to zero. However, the problem is the extension of this region along the $V_{gs}$ axis is very small making it almost impossible to operate the transistor in such a small gate voltage range.

FIG. 2B shows the $g_{m3}$ vs $V_{gs}$ plots 210 and 220 for two virtual channel Ch-1 and Ch-2 shown respectively in FIG. 1D. Here, the threshold voltages (i.e. the work functions) of the channels are designed is such a way that negative region of gm3 curve of Ch-1 overlaps with the positive region of gm3 curve of Ch-2. Therefore, if we had a transistor that has only these two virtual channels we would have a gm3 curve like the one labeled 230. One thing to be noticed is that the gate voltage region over which gm3 value is zero or close to zero has been enhanced. This kind of destructive interference of gm3 is termed as "Derivative Superposition".

Figure 3:
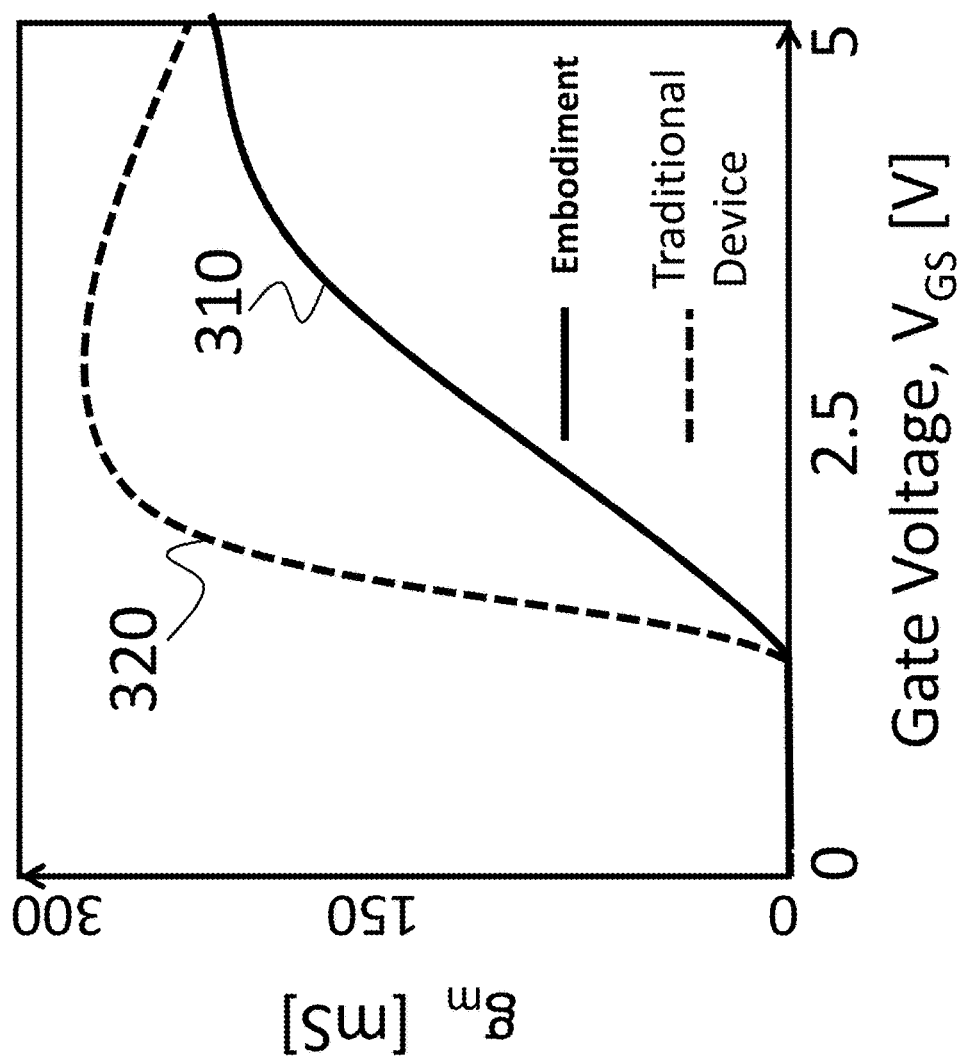
FIG. 3 shows $g_m$ vs $V_{gs}$ curve for a HEMT with flat cap layer and a $g_m$ vs $V_{gs}$ curve for HEMT with cap layer of variable thickens according to some embodiments.

FIG. 3 shows the $g_m$ vs $V_{gs}$ curve 320 for a HEMT with flat cap layer and the $g_m$ vs $V_{gs}$ curve 310 for HEMT with cap layer of variable thickens according to some embodiments. Some embodiments are based on recognition that the linearity of a transistor depends on the rise of transconductance with respect to the gate voltage. A gradual increase of transconductance yields high linearity whereas a rapid increase of transconductance results in low linearity. As shown in this figure, the transconductance of the embodiment rises slowly compared to the HEMT with flat cap layer.

Figure 4:
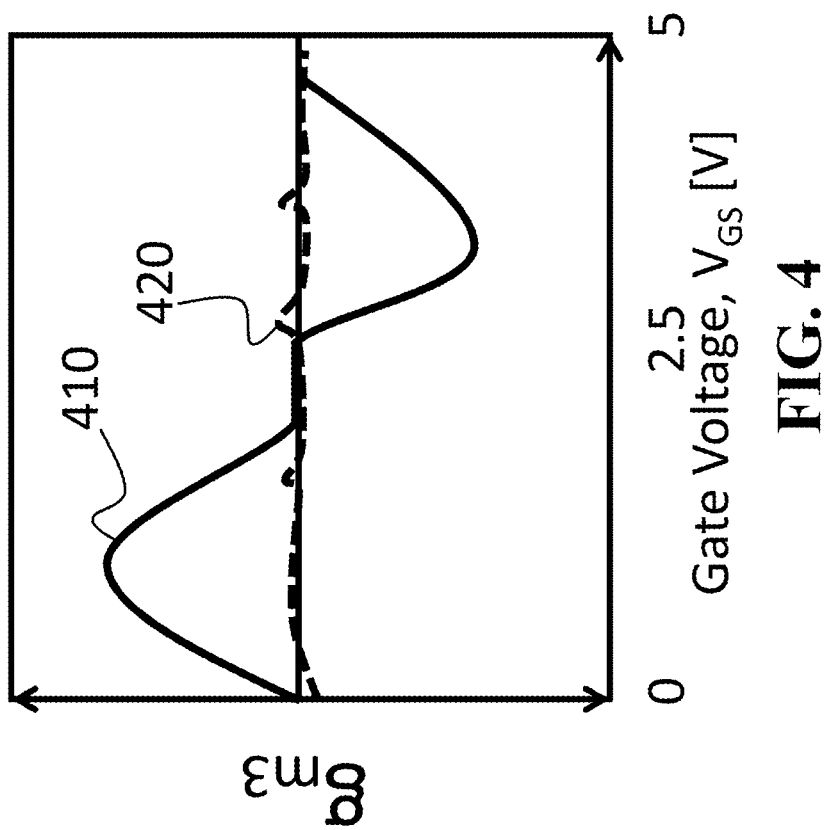
FIG. 4 shows a plot of gm3 vs $V_{gs}$ characteristics of a transistor according to some embodiments.

FIG. 4 shows a plot of gm3 vs $V_{gs}$ characteristics 410 of a transistor according to some embodiments along with gm3 vs $V_{gs}$ characteristics 420 of a conventional HEMT. As mentioned earlier gm3 is the indicator of the linearity of a device—a higher linearity refers to the lower gm3. An ideal linear transistor should have gm3 very close to zero. From this example, it is quite evident that gm3 of the transistor according to some embodiments is less than the gm3 of conventional HEMT.

Figure 5:
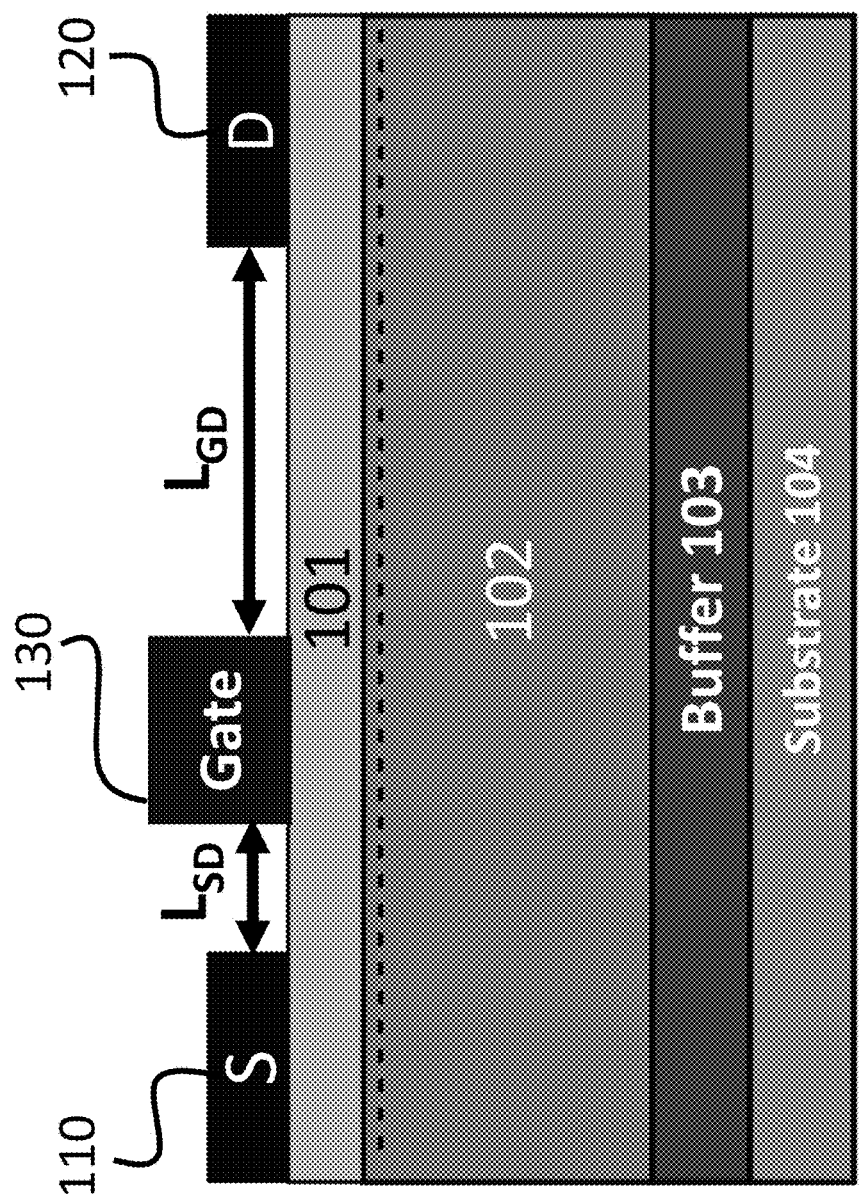
FIG. 5 shows the relative arrangement of Source, Gate and Drain electrodes of HEMT according to one embodiment.

FIG. 5 shows the relative arrangement of Source, Gate and Drain electrodes of HEMT according to one embodiment. The distance between the source and the gate $L_{SD}$ is higher than the distance between the Gate and the Drain, $L_{GD}$. $L_{SD}$ should be as low as possible because high $L_{SD}$ increases source resistance which in turn decreases the linearity of the device. However, $L_{SD}$ cannot be made very small as it increases the parasitic capacitances which decreases cut off frequency. In some implementations, the $L_{SD}$ is smaller than 500 nm. $L_{GD}$ depends on the break down voltage of the device. Higher break down voltage needs higher $L_{GD}$. $L_{GD}$ also depends on the material property of the semiconductor that would be used to form the channel, a wide band gap material would give higher breakdown voltage at a relatively lower $L_{GD}$. For example if the breakdown voltage of the device is $V_{BR}$ then a GaN based device $$L_{GD} = \frac{V_{BR}}{100\,V}\,\mu m.$$

The break-down voltage of any RF transistor has a direct relation with the maximum RF output power, $$P_{OUT} \sim \frac{1}{8} I_{DS\text{-}max} (V_{BR} - V_{knee})^2.$$

Therefore, a high breakdown voltage gives higher output power.

Figure 6:
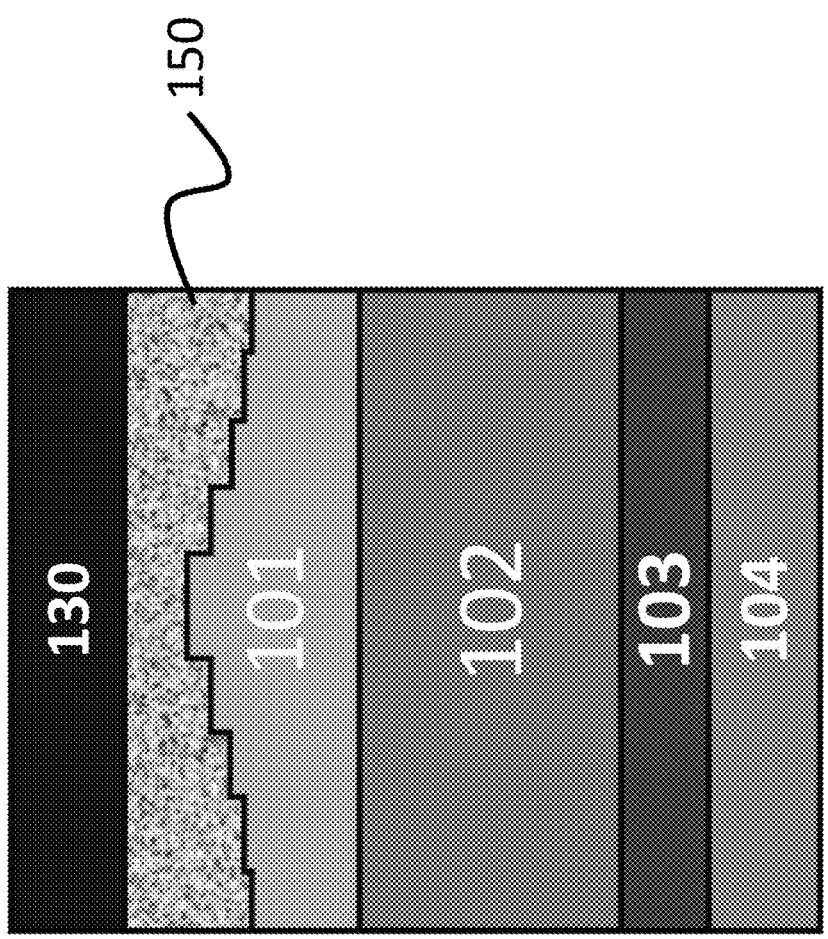
FIG. 6 shows a cross section of a HEMT according to one embodiment.

FIG. 6 shows the cross section of a HEMT according to one embodiment wherein a dielectric layer 150 is sandwiched between the gate electrode 130 and staircase shaped cap layer 101. This oxide layer helps to reduce the gate leakage current and thus improve the maximum cut off frequency of the device. The material of region 150 includes but not limited to, $SiN_x$, $Al_2O_3$, $SiO_2$, $HfO_2$ and doped $HfO_2$.

Figure 7:
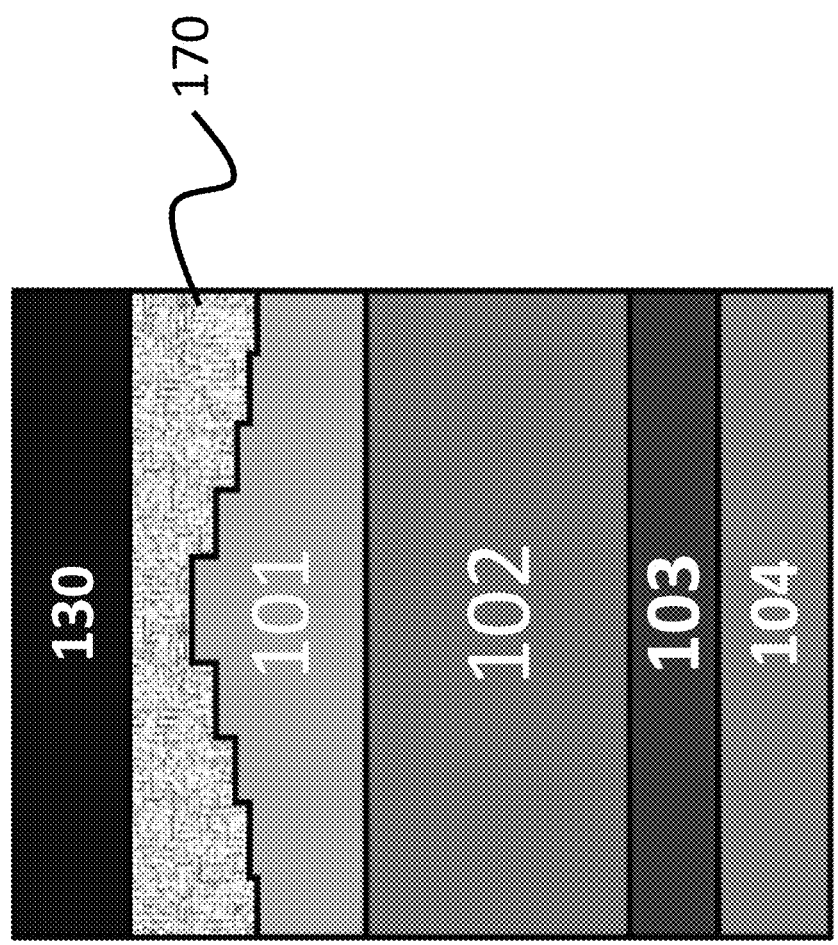
FIG. 7 shows a cross section of a HEMT according to another embodiment.

FIG. 7 shows the cross section of a HEMT according to one embodiment wherein a semiconductor layer 170 is sandwiched between the gate electrode 130 and staircase shaped cap layer 101. In some other embodiments, the layer 170 is p-type doped. In this case the semiconductor layer 170 may include but is not limited to GaN, AlGaN, AlN, Diamond and so on. Such an arrangement provides a normally off operation.

Figure 8:
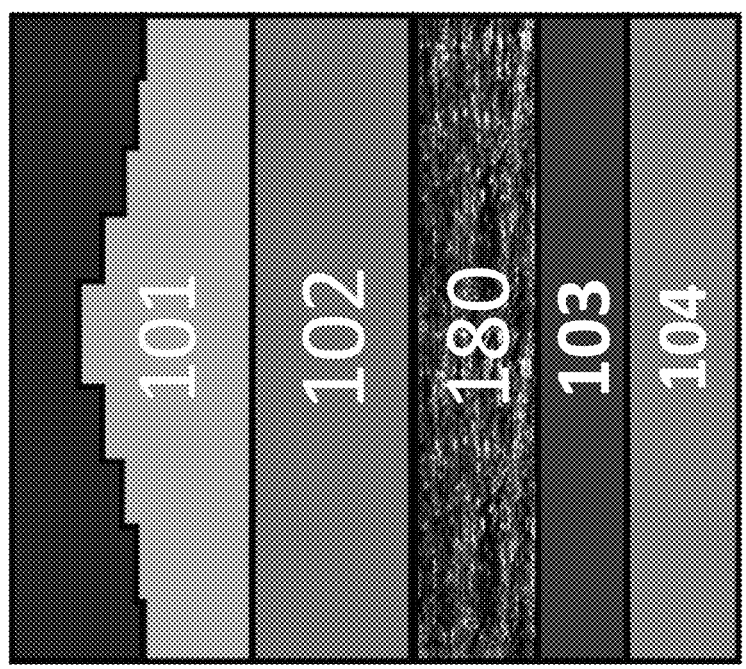
FIG. 8 shows a 2-D cross section view of an exemplar HEMT according to one embodiment.

FIG. 8 shows a 2-D cross section view of an exemplar HEMT according to one embodiment, wherein the semiconductor structure includes a back barrier layer 180 between the channel layer 102 and buffer layer 103. The purpose of a back barrier layer is to provide quantum confinement to the 2-DEG formed at the interface of channel and cap layer. According to one embodiment the back barrier is doped with p-type dopants.

Figure 9:
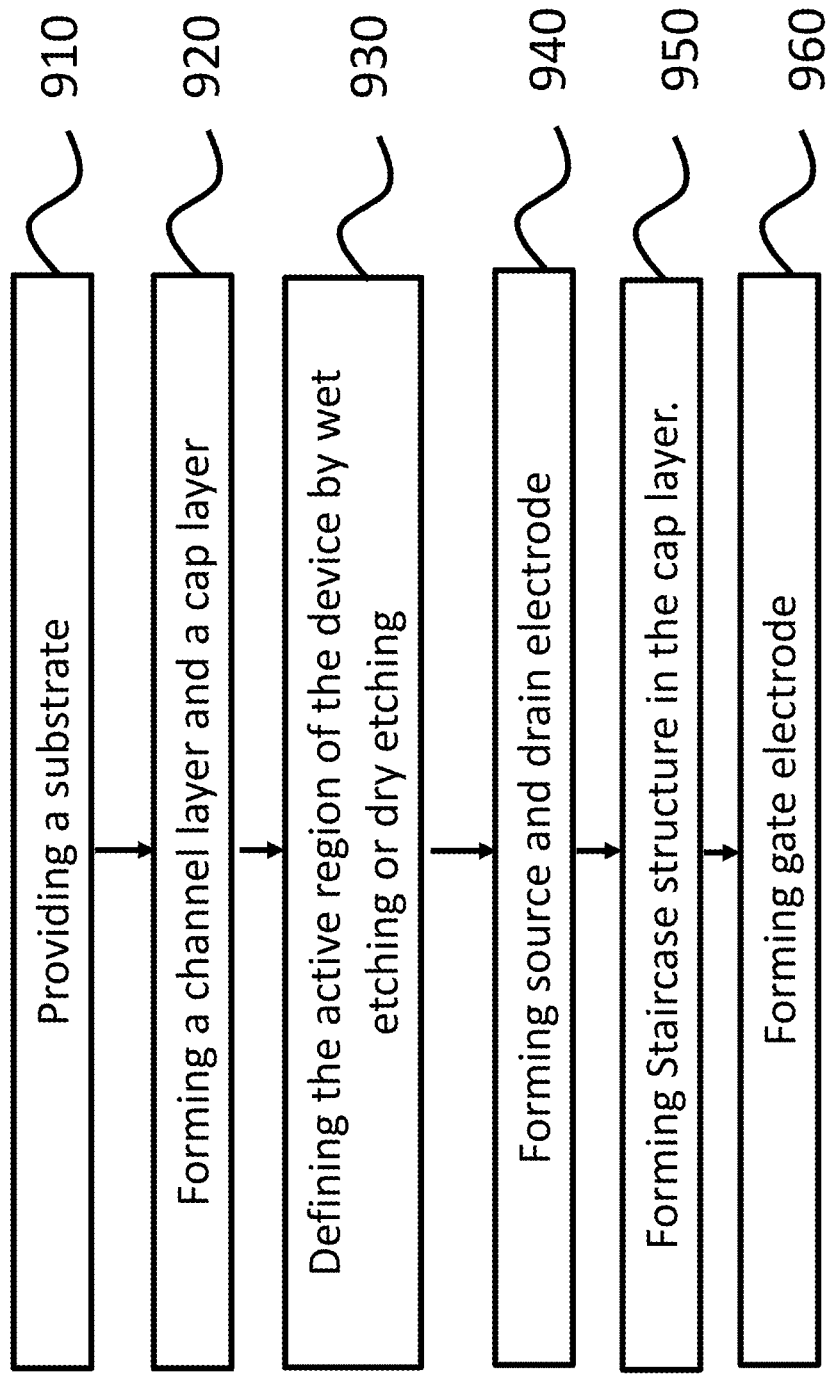
FIG. 9 shows the block diagram of a method for fabricating a semiconductor device according to some embodiments of the invention.

FIG. 9 shows the block diagram of a method for fabricating a semiconductor device according to some embodiments of the invention. The method includes providing substrate 910, making 920 a semiconductor structure comprising at least a III-V channel layer forming a carrier channel in the semiconductor structure. The material of top barrier layer has a higher bandgap than the bandgap of material in the III-V channel layer. According to some embodiments, various methods can be adopted for the growth and formation of top barrier layer or channel layer, including but not limited to a Chemical Vapor Deposition (CVD), a Metal-Organic-Chemical-Vapor-Deposition (MOCVD), a Molecular Beam Epitaxy (MBE), a Metal-Organic Vapor Phase Epitaxy (MOVPE) and a Plasma Enhanced Chemical Vapor Deposition (PECVD) and a microwave plasma deposition system.

The method then includes, defining the active region of the transistor by wet etching or dry etching 930.

Further the method also includes 940, formation of source and the drain electrode to electrically connect to the carrier channel using one or combination of an ebeam deposition, a joule evaporation, a chemical vapor deposition and a sputtering process. Then the sample is annealed >800° C. in vacuum or N2 environment to form the ohmic contact.

Then the method includes 950, formation of stair case by repeated lithography and dry etching in the cap layer on which the gate electrode needs to be deposited.

Further method also includes 960, the formation of metal slab for the gate electrode. The formation of this metal slab can be done using one or combination of Lithography→Metal Deposition→Lift-off and Metal deposition-→Lithography→Etching. Here the lithography could be performed using, including but not limited to photo-lithography, electron-beam lithography. Metal deposition can be done using one or combination of an ebeam deposition, a joule evaporation, a chemical vapor deposition and a sputtering process.

Although the invention has been described by way of examples of preferred embodiments, it is to be understood that various other adaptations and modifications can be made within the spirit and scope of the invention. Therefore, it is the objective of the appended claims to cover all such variations and modifications as come within the true spirit and scope of the invention.

We claim:

1. A high electron mobility transistor (HEMT), comprising:
a semiconductor structure including a cap layer and a channel layer forming a heterojunction, such that a two dimensional electron gas channel is formed at the interface of cap layer and the channel layer; and
a set of electrodes including a source electrode, a drain electrode, and a gate electrode deposited on the cap layer, wherein the gate electrode is arranged between the source and the drain electrode along the length of the channel of the HEMT, wherein the thickness of the cap layer at least under the gate electrode is varying along the width of the channel of the HEMT.

2. The HEMT of claim 1, wherein a cross-section of the cap layer under the gate electrode has a stair case shape having at least two trends and risers, wherein each stair of the stair case shape forms a virtual channel with a threshold voltage different from a threshold voltage of a neighboring virtual channel.

3. The HEMT of claim 1, wherein the thickness of the cap layer outside the gate electrode is constant.

4. The HEMT of claim 2, further comprising:
a layer of dielectric arranged in between the gate electrode and the cap layer.

5. The HEMT of claim 2, wherein the trends have identical widths.

6. The HEMT of claim 2, wherein the trends have different widths.

7. The HEMT of claim 2, wherein the risers have identical heights.

8. The HEMT of claim 2, wherein the risers have different heights.

9. The HEMT of claim 1, wherein a distance between the source electrode and the gate electrode is greater than a distance between the gate electrode and the drain electrode.

10. The HEMT of claim 1, where in the material of the channel layer includes one or combination of gallium nitride (GaN), indium gallium nitride (InGaN), gallium arsenide (GaAs), and indium gallium arsenide (InGaAs), and wherein the material of the cap layer includes one or combination of aluminum gallium nitride (AlGaN), indium gallium nitride (InGaN), aluminum nitride (AlN), aluminum gallium arsenide (AlGaAs), aluminum arsenide (AlAs), and indium aluminum gallium arsenide (InAlGaAs).

11. The HEMT of claim 1, wherein a semiconductor layer is sandwiched between the gate electrode and the cap layer, and wherein the sandwiched semiconductor layer is doped with impurities having a conductivity opposite to the conductivity of the carrier channel.

12. The HEMT claim 1, wherein the semiconductor structure includes a back barrier layer beneath the channel layer.

13. The HEMT of claim 12, wherein the back barrier layer is p doped.

14. A method for manufacturing a high electron mobility transistor (HEMT), comprising:
providing a substrate and a semiconductor structure with at least one carrier channel of the HEMT;
etching the semiconductor structure to define an active region of the HEMT;
forming a source and a drain electrode by one or combination of a metal deposition, a lift-off, and a rapid thermal annealing;
forming a cap layer having a varying thickness along the width of the channel of the HEMT by repeated lithography and etching; and
forming a gate electrode arranged between the source and the drain electrode along the length of the channel of the HEMT.

15. The method of claim 14, wherein a cross-section of the cap layer under the gate electrode has a stair case shape having at least two trends and risers, wherein each stair of the stair case shape forms a virtual channel with a threshold voltage different from a threshold voltage of a neighboring virtual channel.

16. The method of claim 14, wherein the source, the drain and the gate electrodes are formed using one or combination of an electron beam physical vapor deposition (EBPVD), a joule evaporation, a chemical vapor deposition, and a sputtering process.

17. The method of claim 14, wherein the cap layer is formed using one or combination of a chemical vapor deposition (CVD), Metal-Organic Chemical Vapor Deposition (MOCVD), a Molecular Beam Epitaxy (MBE), a Metal Organic Vapor Phase Epitaxy (MOVPE), a Plasma Enhanced Chemical Vapor Deposition (PECVD), and a microwave plasma deposition.

18. The method of claim 14, further comprising:
forming a back barrier layer beneath the channel layer.

19. The method of claim 14, further comprising:
forming a dielectric layer beneath the gate electrode using one or combination of an atomic layer deposition (ALD), a chemical vapor deposition (CVD), Metal-Organic Chemical Vapor Deposition (MOCVD), a Molecular Beam Epitaxy (MBE), a Metal Organic Vapor Phase Epitaxy (MOVPE), a Plasma Enhanced Chemical Vapor Deposition (PECVD), and a microwave plasma deposition.

* * * * *